United States Patent [19]
Aufderheide et al.

[11] Patent Number: 5,062,916
[45] Date of Patent: Nov. 5, 1991

[54] METHOD FOR THE MANUFACTURE OF ELECTRICAL MEMBRANE PANELS HAVING CIRCUITS ON FLEXIBLE PLASTIC FILMS

[75] Inventors: Brian E. Aufderheide, Cedarburg; Michael J. Robrecht, Whitefish Bay; Wayne R. Kelley, Cedar Grove, all of Wis.

[73] Assignee: W. H. Brady Co., Milwaukee, Wis.

[21] Appl. No.: 561,027

[22] Filed: Aug. 1, 1990

[51] Int. Cl.$^5$ .............................................. B32B 31/00
[52] U.S. Cl. ...................... 156/269; 29/846; 156/247; 156/277; 156/902; 174/68.1; 428/209; 428/901

[58] Field of Search .............. 156/247, 250, 269, 270, 156/277, 289, 324, 634, 902; 29/846; 174/68.1; 428/209, 901; 427/96

[56] References Cited

U.S. PATENT DOCUMENTS 4,935,093 6/1990 Reeb .............................. 156/902 X Primary Examiner—William A. Powell
Attorney, Agent, or Firm—Quarles & Brady

[57] ABSTRACT

A method for producing electrical membrane panels including spaced conductive circuits on separate plastic film layers in which the membrane panels are formed on webs of the plastic films laminated together, and individual membrane panels are severed from the combined webs after being formed thereon.

8 Claims, 7 Drawing Sheets

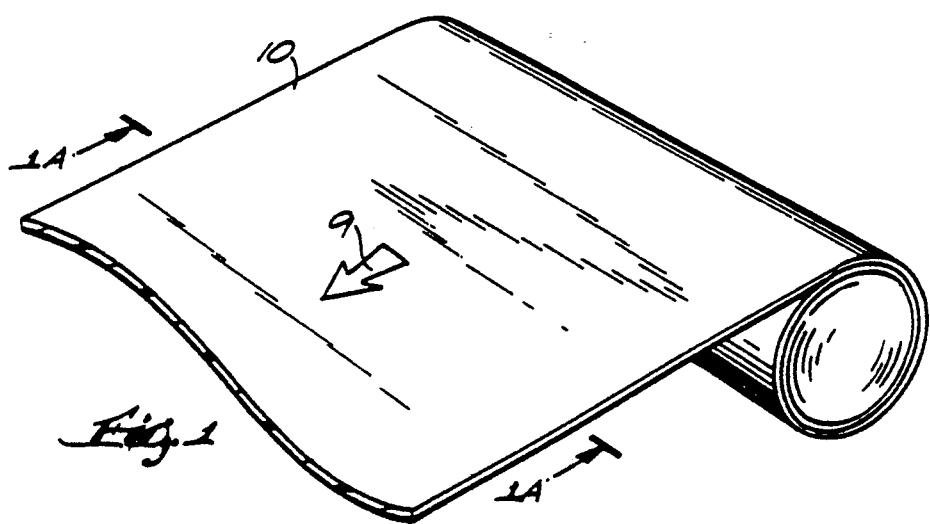
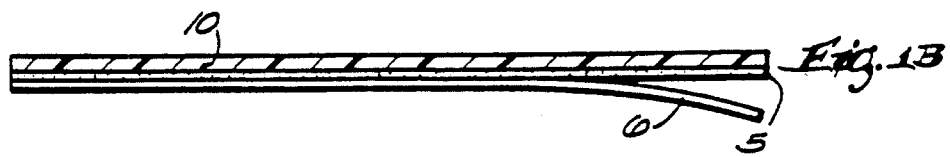
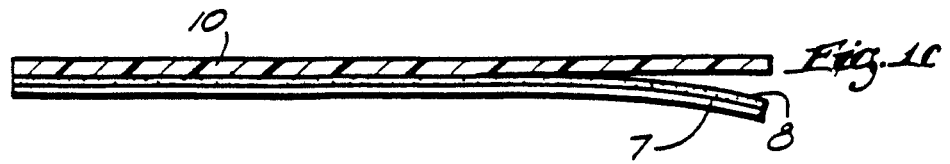

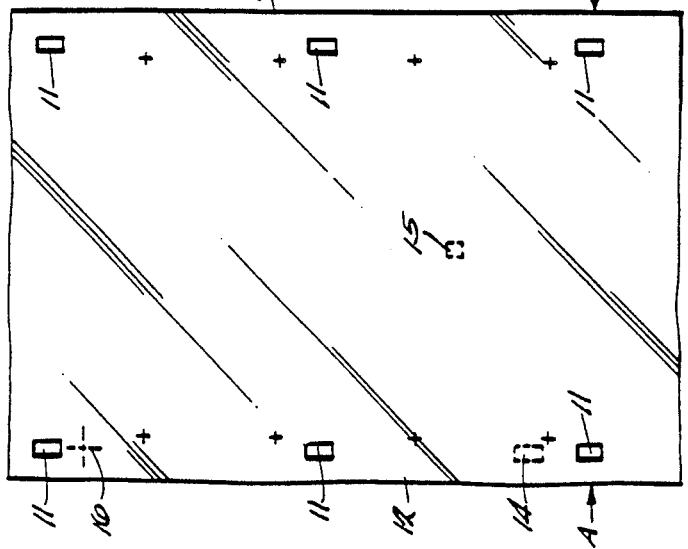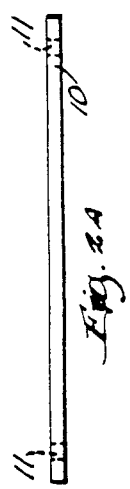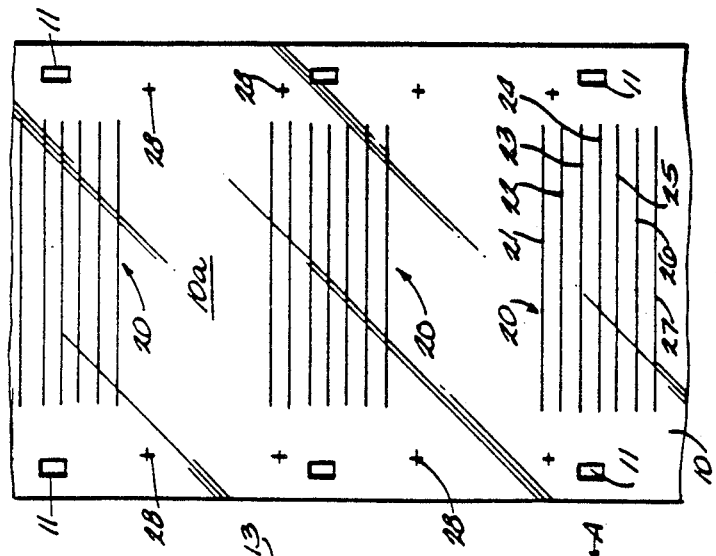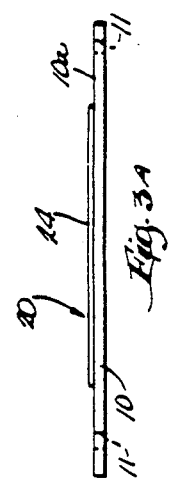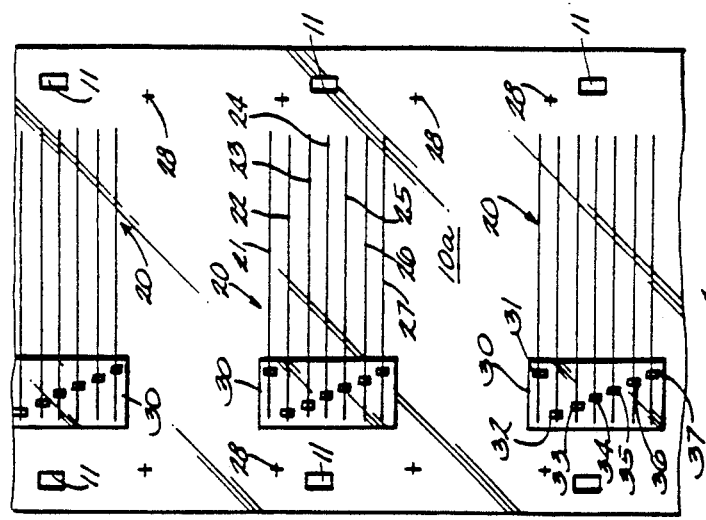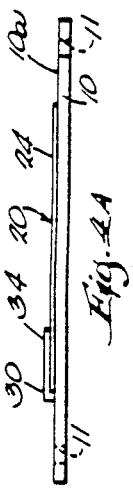

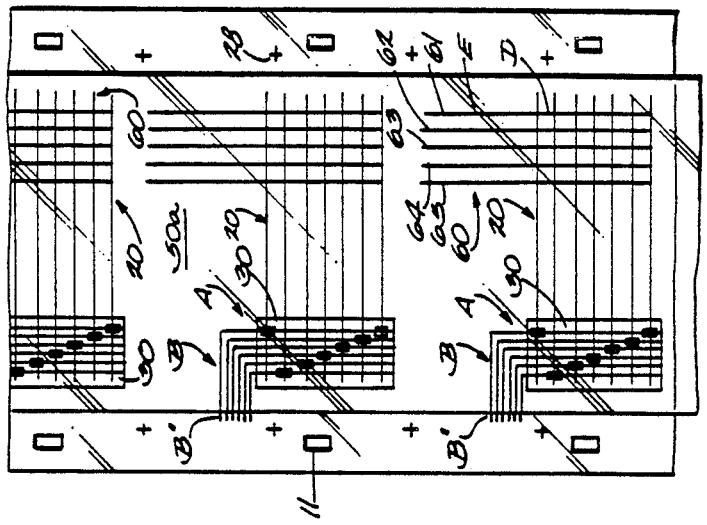
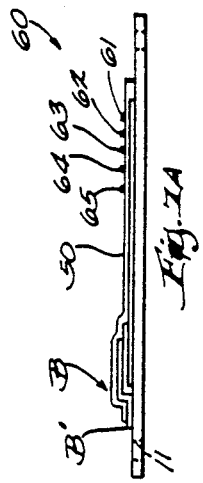
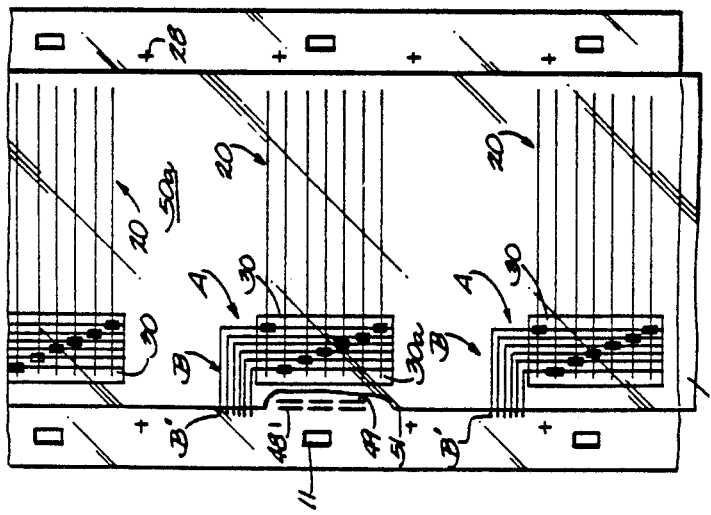
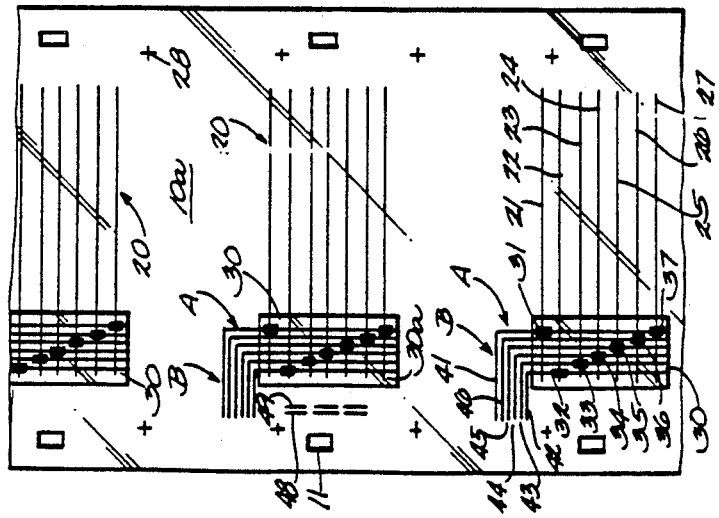
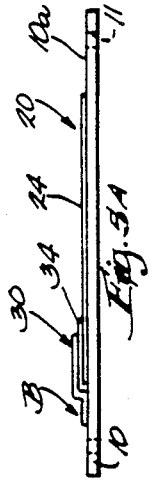

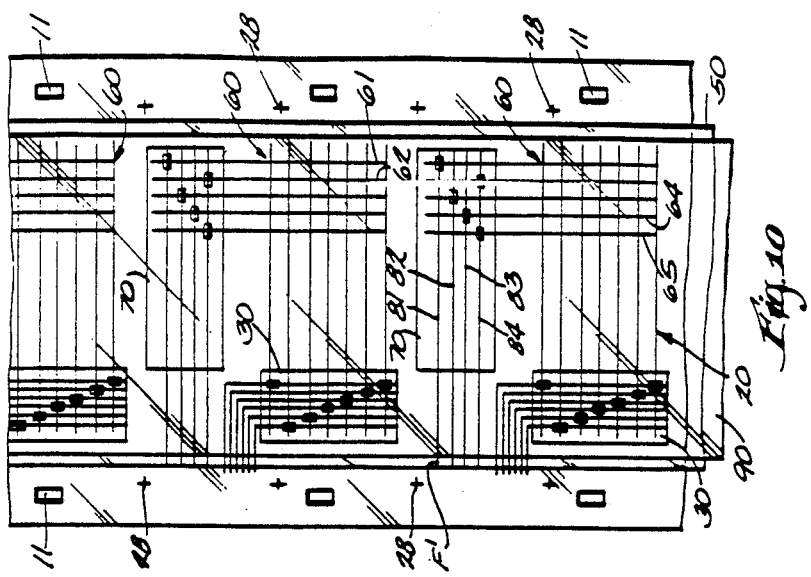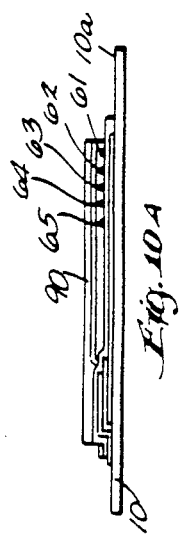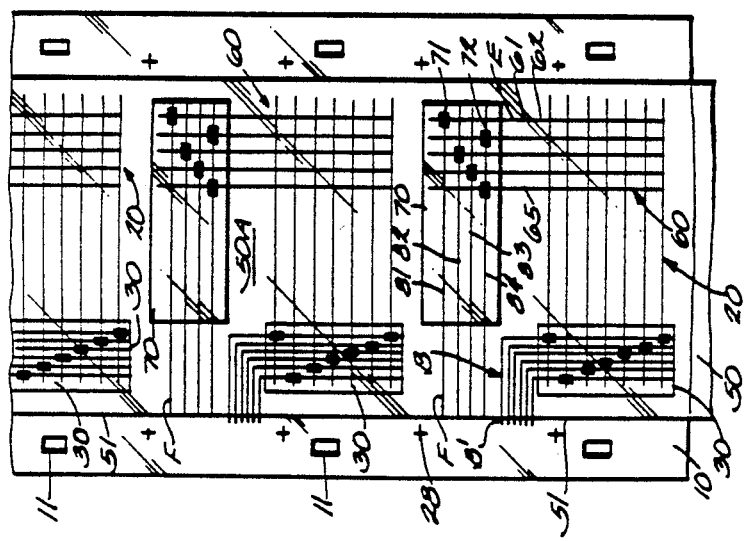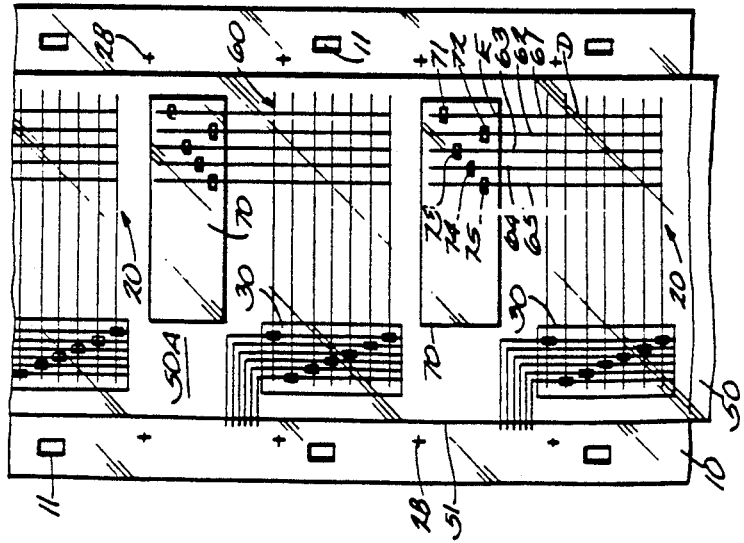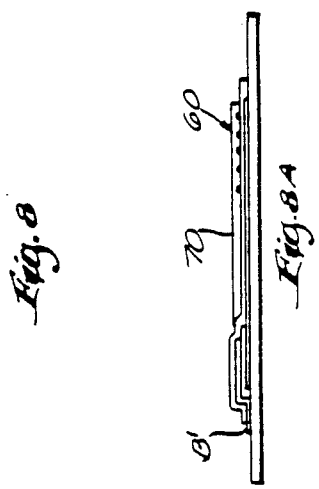

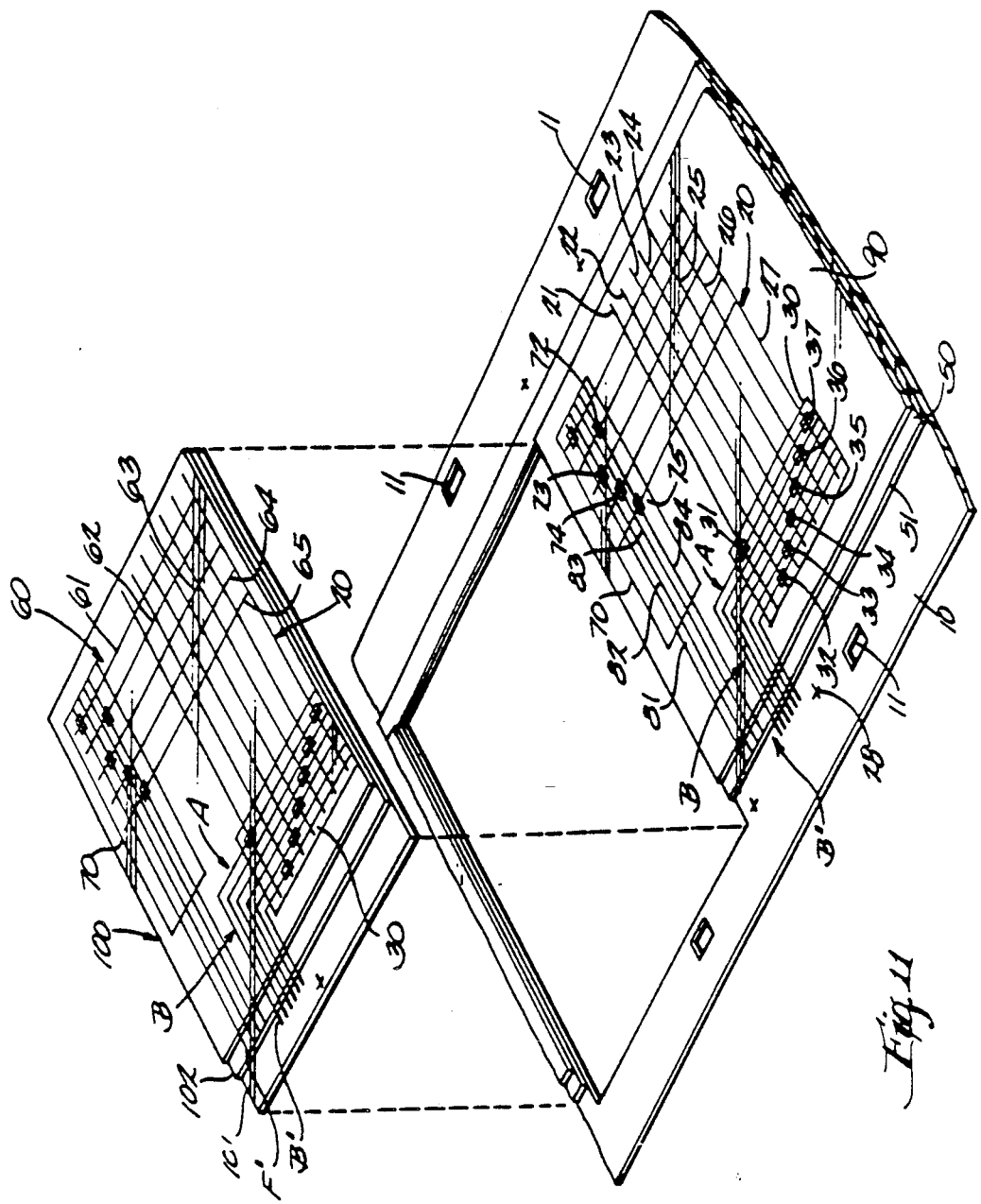

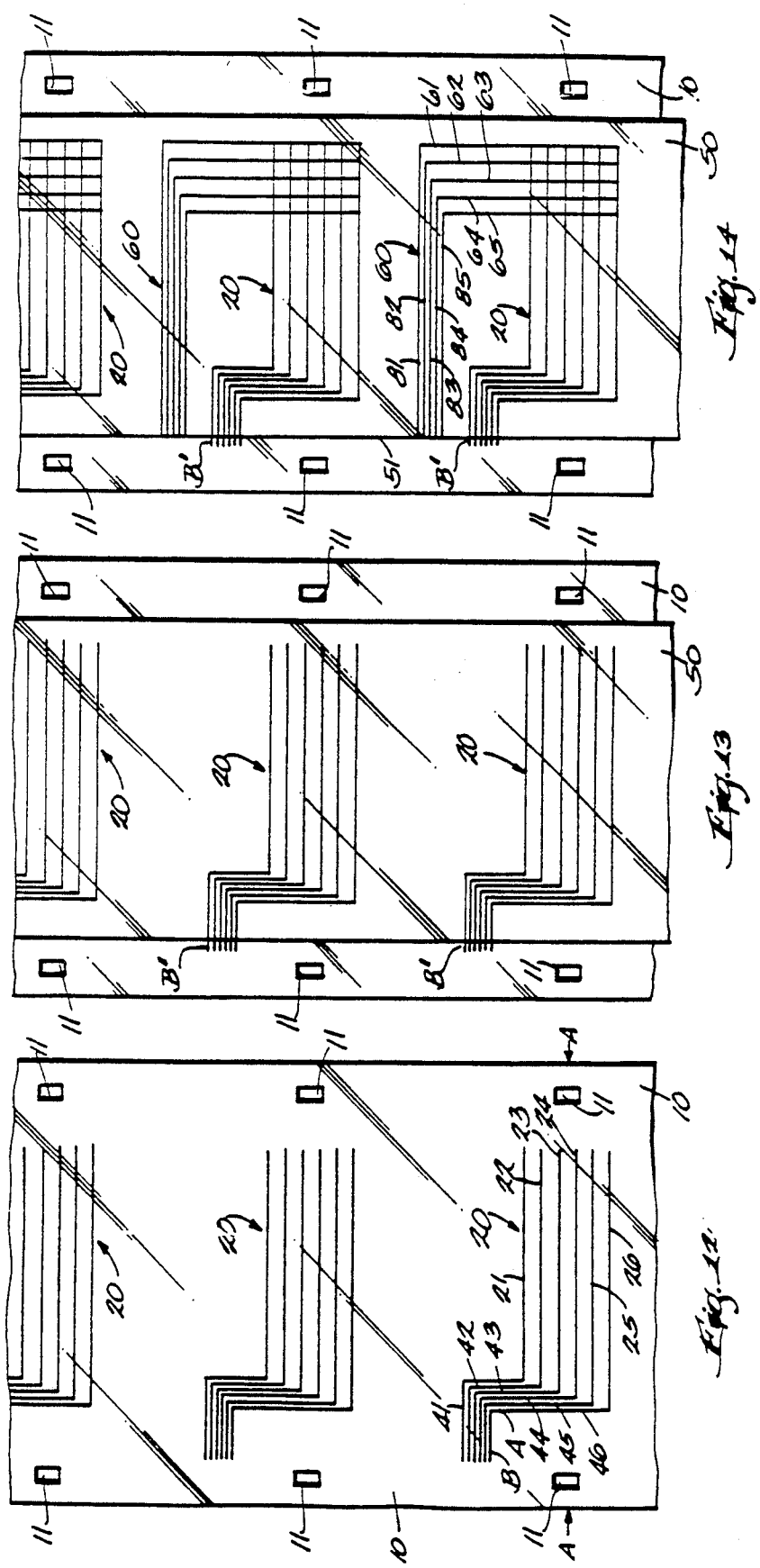
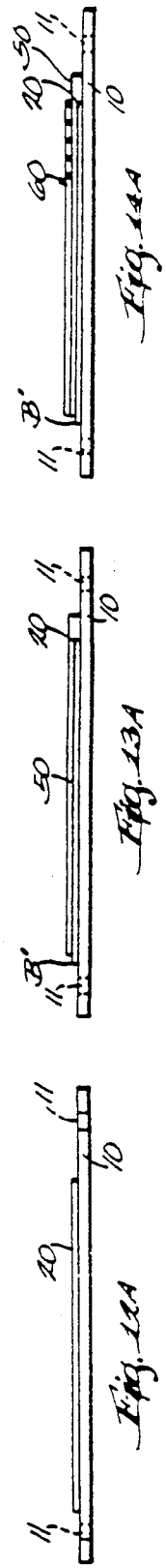

METHOD FOR THE MANUFACTURE OF ELECTRICAL MEMBRANE PANELS HAVING CIRCUITS ON FLEXIBLE PLASTIC FILMS

FIELD OF THE INVENTION

The present invention relates to the art of manufacturing electrical membrane panels including spaced conductive circuits on separate layers of plastic film.

BACKGROUND OF THE INVENTION

Electrical membrane panels of the type to which the present invention relates include spaced first and second conductive circuits that are formed, such as by printing or vacuum deposition, on separate layers of flexible plastic film. The typical method for producing this type of panel is to form the circuits on individual sheets of plastic film and then join the two sheets of film together, such as by lamination, after the two circuits have been completely formed. This technique can be expensive and entail difficult and time consuming hand lay-up and registration operations, particularly when the plastic films are very thin such as about 1 mil to 5 mils thick. The separate films would be hand registered in stacks and then laminated in a press or autoclave under heat and pressure, but these types of hand operations offer significant potential for problems with dust, dirt, finger prints, kinks and creasing of the films.

The new method which we have developed, as fully described hereinbelow, eliminates all or most of the problems of the foregoing separate sheet method. One of our objectives was to provide a new process that eliminates or reduces hand operations. Another objective was to provide a manufacturing method wherein the membrane panels would be much cleaner, and free from kinks and creases. A further objective was to provide a method for manufacturing electrical membrane panels of flexible plastic films at a reduced cost and without the need for capital equipment such as a press or autoclave for final assembly. These and other objectives of the invention will become apparent from the detailed description which follows.

SUMMARY OF THE INVENTION

Our new method for the manufacture of electrical membrane panels includes forming a plurality of first conductive circuits on a substrate web of flexible plastic film while the film is in the form of an elongated web, joining at least one second web to the substrate film and forming a plurality of second conductive circuits on the second web, and then severing individual panels from the composite structure including the substrate and second webs after each of the circuits has been fully completed. Thus, a plurality of panels are formed on a substrate web and a second web laminated together wherein the panels are arranged in columns and rows along the composite of the two webs. Our new method also provides for accurate registration of the several components of each panel relative to one another. The first and second circuits can be applied to the substrate and second webs by techniques generally used in manufacturing electrical membrane panels, such as printing, particularly screen printing, and vacuum deposition techniques.

DESCRIPTION OF THE DRAWINGS

The ensuing full and enabling description of the new process of our invention is made by reference to the accompanying drawings, in which FIGS. 1-11 illustrate the first embodiment of a method according to the present invention.

FIG. 1 is a perspective view illustrating the first step of the first embodiment, and FIGS. 1A, 1B and 1C are transverse sectional views along the plane of line A—A of FIG. 1;

FIG. 2 is a plan view illustrating the product structure after completion of the second step of the method, and FIG. 2A is a transverse sectional view of the product of FIG. 2 along the plane of line A—A;

FIG. 3 is a plan view illustrating the product structure after completion of the third step of the method, and FIG. 3A is a sectional view of the product of FIG. 3 along the plane of line A—A;

FIG. 4 is a plan view illustrating the product structure after completion of the fourth step of the method, and FIG. 4A is a transverse sectional view of the product of FIG. 4 along the line A—A;

FIG. 5 is a plan view illustrating the product structure after completion of the fifth step of the method, and FIG. 5A is a transverse sectional view of the product of FIG. 5 along the plane of line A—A;

FIG. 6 is a plan view, with a portion broken away, illustrating the product structure after completion of the sixth step of the method, and FIG. 6A is a transverse sectional view of the product of FIG. 6 along the plane of line A—A;

FIG. 7 is a plan view illustrating the product structure after completion of the seventh step of the methodand FIG. 7A is a transverse sectional view of the product of FIG. 7 along the plane of line A—A;

FIG. 8 is a plan view illustrating the product structure after completion of the eighth step of the method, and FIG. 8A is a transverse sectional view of the product of FIG. 8 along the plane line A—A;

FIG. 9 is a plan view illustrating the product structure after completion of the ninth step of the method, and FIG. 9A is a transverse sectional view of the product of FIG. 9 along the plane of line A—A;

FIG. 10 is a plan view illustrating the product structure after completion of the tenth step of the method, and FIG. 10A is a transverse sectional view of the product of FIG. 10 along the plane of line A—A; and FIG. 11 is a perspective view illustrating the last step in the method of the first embodiment. FIGS. 12-14 illustrate the second embodiment of a method according to the present invention.

FIG. 12 is a plan view illustrating the product structure after completion of the third step of the method of the second embodiment, and FIG. 12A is a transverse sectional view of the product of FIG. 12 along the plane of line A—A;

FIG. 13 is a plan view illustrating the product structure after completion of the fourth step of the method of the second embodiment, and FIG. 13A is a transverse sectional view of the product of FIG. 13 along the plane A—A; and FIG. 14 is a plan view illustrating the product structure after completion of the fifth step of the method of the second embodiment, and FIG. 14A is a transverse sectional view of the product of FIG. 14 along the plane A—A.

DESCRIPTION OF PREFERRED EMBODIMENTS

(1) First Embodiment, FIGS. 1–11

Figure 15:
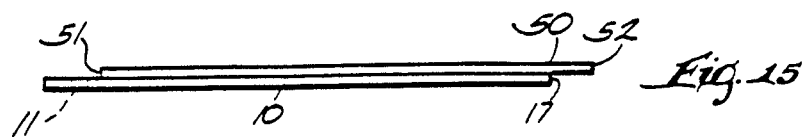
FIG. 15 is a sectional view illustrating an alternate arrangement of the second web relative to the substrate web suitable for practice of the invention.

FIGS. 1-11 illustrate the steps involved in a first method of the present invention for the manufacture of a flexible membrane panel including conductive spaced electrical circuits formed on two plastic films. The method includes performing the various steps in the sequence in which they are described. The flexible panel described herein as an example of a type of panel that can be made by the method of this invention is a touch panel designed to provide an output signal of the X-Y position at which the panel is touched by an operator's finger or a stylus. In accordance with the invention, a series of flexible electrical panels are made on two webs of plastic film laminated together and which remain in web form until the final step of cutting an individual panel from the combined webs.

Step (1), FIGS. 1 and 1A–1C

The first step of the method involves providing a substrate web 10 of flexible plastic film. In accordance with subsequent steps of the method, a plurality of conductive circuits will be formed on substrate web 10 arranged in one or more longitudinal columns along the web and in transverse rows across the web with there being one or more circuits in each row.

If the panels to be formed using web 10 are to be transparent, the web should be a transparent, or at least translucent, plastic film. Any plastic film suitable for membrane switches and touch panels can be used for substrate web 10, with a polyester film such as Mylar ® sold by Dupont being preferred, but other films including nylons, polycarbonates, etc. can be used. Web 10 can be a thin film, such as on the order of about 2 mils to 10 mils thick; thicker films can be used for the substrate web, but an advantage of the method of the present invention is that it can be employed to form membrane panels on very thin plastic films.

The web 10 can be a single layer of plastic film such as illustrated in the cross-section view of FIG. 1A. Alternate constructions for the web are illustrated in the cross-section views of FIGS. 1B and 1C. As shown in FIG. 1B, the web 10 may include a layer of pressure sensitive adhesive 5 (or other suitable adhesive) coated onto its bottom surface; a release liner 6 is applied over the exposed surface of adhesive 5 so as to protect it during processing and until ready for use. When a panel severed from the web 10 as described later is to be applied to a surface, the liner 6 can be stripped away and the panel adhered to the surface by means of the adhesive layer 5. As shown in FIG. 1C, a carrier web 7 having a layer of low tack pressure sensitive adhesive 8 along one of its surfaces is joined to the bottom surface of web 10. The carrier may be of a material such as paper and will be used to support the web 10 during subsequent processing steps; the carrier (with adhesive 8) is removed after completion of the processing or at the time a panel from the web 10 is to be applied to a surface. The web constructions of both FIGS. 1B and 1C facilitate the processing of thin films, such as a web 10 of 1 to 3 mils thick in that the liner 6 in the case of FIG. 1B and carrier 7 in the case of FIG. 1C provide physical support for the web 10 during the processing steps.

Web 10 is illustrated in the form of a roll of plastic film in FIG. 1. It should be noted that the web typically will be several hundred feet long to several thousand feet long as a feature of the present invention is to retain substrate web 10 in the form a long web throughout the subsequent process method steps. Thus, web 10 as provided in the initial step of the method should be long enough to accommodate the number of rows of circuits that are to be applied onto the web in subsequent steps and wide enough to cover the number of columns of circuits that are to be formed across the web. Web 10 will be advanced longitudinally for subsequent processing steps as indicated by arrow 9 in FIG. 1.

Step (2), FIGS. 2 and 2A.

The second step of the method involves defining registration means longitudinally along the web 10, with there being one registration means for each row of conductive circuits to be formed on the substrate web. In FIG. 2, the registration means 11 for each row is illustrated as a rectangular aperture near longitudinal edge 12 of web 10 and a similar longitudinal aperture near longitudinal edge 13 of the web. The apertures forming the registration means 11 are shown in full line in FIG.2, and three sets thereof are shown in the segment of web 10 in the drawings as there will be three rows of circuits formed on the web as illustrated in the drawings. The registration means can be in any preselected position relative to each row of circuits to be formed across the substrate web.

Alternate constructions and locations for the registration means are shown in dashed line in FIG. 2. For example, a single rectangular aperture 14 can be located along a longitudinal edge of the web for each row of circuits, or a single aperture 15 can be formed along an interior section of the web such as between adjacent rows of circuits. Also, the registration means need not be apertures formed in the web, but can include printed marks such as the printed cross 16, and there can be one or more such printed registration means located as selected along the substrate web relative to each row of circuits to be formed on the web.

When apertures are used for the registration means, they can be of any desired configuration instead of the rectangles illustrated in FIG. 1, such as circles, ovals, triangles, etc. The registration means are to be detectable by the equipment used to form conductive circuitry on the substrate, and thus generally should be detectable optically, pneumatically or by other means with various types of printing and/or vacuum deposition equipment.

The registration means can be formed simultaneously with the formation of the conductive first traces described in step (3) which typically would be the case when the registration means are printed marks such as printed cross 13 and the first traces are applied by printing. Also, the registration means can be formed immediately prior to application of the first traces of the web in step (3); thus, for example, apertures 11 can be die cut in the web just prior to the application of the first traces onto the web in step (3).

Step (3), FIGS. 3 and 3A

Following completion of step (2), the third step of the method includes applying the first components of a plurality of conductive first circuits 20 along a surface of substrate web 10. The circuits 20 are spaced apart from one another, and FIG. 3 shows a single column of circuits 20 along web 10, with one circuit in each row of the column; however, as noted above, there may be two or more columns of circuits applied along the web, and two or more conductive first circuits in each row. Further, the components of each circuit 20 are applied to the web 20 by aligning with the registration means 11 of the web; thus, as shown in FIG. 3, there is a registration means 11 for each row of first circuits 20 formed on the web. Circuits 20 can be applied to web 10 by means of vacuum deposition techniques, such as sputtered deposition of metals, metal alloys or conductive compounds, or by printing techniques such as screen printing with conductive inks. In the exemplary embodiment of FIGS. 1-11, the first components of each first circuit 20 applied in this step (3) comprises a plurality of evenly spaced conductive first traces 21-27 applied transversely across the web 10 along a selected zone of the web between the registration means 11. The sectional view of FIG. 3A illustrates the manner in which conductive trace 24 has been applied onto surface 10a of the web 10. A touch panel will typically include a large number of traces, but only six traces 21-27 are shown in drawings for clarity of description.

As a useful optional feature, visual alignment marks 28 can be applied onto the web 10 concurrently with application of the first traces on the web and with the same equipment, e.g. screen printer or vacuum deposition equipment, used to apply the traces. Marks 28 can be used to assist the person operating the machine in lining up subsequent passes with the first traces to obtain an initial alignment, bearing in mind, however, that the machine will sense the registration means 11 to accurately align subsequent passes with the first circuits 20. Four visual alignment marks 28 are depicted in the drawings in association with each first circuit 20, but other configurations, arrangements and number of marks 28 can be used instead of the exemplary disclosure.

Step (4), FIGS. 4 and 4A

In the fourth step of the method, a first dielectric coating 30 is applied over selected portions of traces 21-27 of each conductive first circuit 20. As depicted in FIG. 4, the first dielectric coating 30 is applied as a pattern in the form of a rectangle over end portions of traces 21-27 of each first circuit. The coating 30 includes an aperture over each trace; thus, coating 30 includes aperture 32 over trace 22, aperture 33 over trace 23, aperture 34 over trace 24, aperture 35 over trace 25, aperture 36 over trace 26, and apertures 31 and 37 over traces 21 and 27 respectively, apertures 31, 37 being arranged in a column.

Any suitable insulating material can be used for the dielectric coating 30. During development of the invention, we found that screen printing an amine cured epoxy ink at a thickness of about 0.6 to 0.8 mils, and curing the ink by heating, provided an effective dielectric coating. Also, to assure complete insulation of first traces 21-27 from the first leads to be applied in next step (5) of the method except where contact between the traces and leads is desired within an aperture, one or more additional layers of the dielectric coating can be applied.

A first dielectric coating 30 is formed in a selected pattern for each first circuit 20 on the substrate web. Registration means 11 are utilized by the equipment used to form the dielectric coatings to accurately register each coating 30 relative to its respective first circuit 20.

Step (5), FIGS. 5 and 5A

Next, the second components of each first circuit 20 comprising a plurality of conductive first leads are formed on the exposed surface 30a of each first dielectric coating 30. As shown in FIG. 5, conductive first leads 41-46 are formed, preferably by screen printing of conductive ink, on surface 30a, and there is a lead for each longitudinal column of apertures in the coating 30 applied in step (4). Each lead 41-46 makes electrical contact through an aperture 31-37 with a respective first trace 21-27 exposed within an aperture. Thus, lead 41 makes electrical contact with first trace 21 within aperture 31 and makes electrical contact with first trace 27 within aperture 37. First leads 42-46 make similar electrical contact with first traces 22-26, within apertures 32-36, respectively.

Also, each first lead 41-46 has a portion extending onto surface 10a of substrate web 10 on a zone thereof outside the boundary of each first circuit 20. In the first illustrative embodiment, referring now specifically to first lead 41, each first lead 41-46 is L-shaped and includes a longitudinal section A that extends across dielectric coating 30 and across the apertures formed therein, and a transverse section B extending a selected distance along surface 10a of the substrate web and beyond the left boundary of each first circuit 20.

The first leads 41-36 must be accurately positioned with respect to a dielectric coating 30 and the first traces of a first circuit 20 associated therewith. The registration means 11 are utilized by the equipment used to apply the first leads in order to achieve accurate registration of the first leads relative to the other structure of each first circuit.

The arrangement of the first traces and first leads of the first circuits 20 described in this first embodiment of the invention (and the similar arrangement of the components of the second circuits described below) is particularly useful for a membrane panel construction having a large number (e.g. 32 to 100) of first traces and a smaller number (e.g. 16-32) of first leads. This type of panel design usually requires that a selected number of first traces, but not all, must be connected to each first lead so as to allow using a 16 or 32 pin connector for connecting external circuitry to the panel. The dielectric coating 30 is used to prevent shorting between each first lead and the first traces that are not to be connected to it.

As another useful optional feature, we have found it helpful to apply visual longitudinal alignment lines on the web 10 concurrently with the application of the first leads 41-46 that will be employed as a visual aid for the person operating laminating equipment in the next step (6) of the method. As illustrated in FIG. 5, spaced visual longitudinal alignment lines 48 and 49 are applied longitudinally on web 10 alongside each first circuit 20, and the lines 48 and 49 are spaced slightly inward of the ends of the transverse sections B of the first leads 41-46;

lines 48 and 49 are illustrated in connection with the middle first circuit 20 shown in FIG. 5, but can be applied alongside each row of first circuits.

Step (6), FIGS. 6 and 6A

Turning now to FIGS. 6 and 6A, the next step in the process of the invention involves laminating second web 50 of flexible plastic film to the substrate web 10. Second web 50 can be of the same type of plastic film used for substrate web 10, but can be very thin, such as about ¼ mil to 5 mils thick, preferably about one mil thick when it forms a dielectric layer between circuits of a touch panel. Second web 50 can include a layer of adhesive, such as pressure sensitive adhesive, thermoplastic adhesive, UV curable adhesive, thermoset adhesive or any other selected adhesive, preferably about ¼ mil to 5 mils thick, on its surface that is to be joined to the web 10; also, however, suitable adhesive can be first applied to substrate web 10 over a selected zone thereof and second web 50 thereafter joined to the adhesive.

Second web 50 extends longitudinally along substrate web 10, and is shown in this first embodiment as being narrower than the web 10. Second web 50 covers each first circuit 20 formed on web 10, including all or most of the first dielectric coating 30 associated therewith, except for a short connection end portion of the first leads 41-46, indicated as portion B' of first lead 41 in FIG. 6, which will be used to connect each first lead to external circuitry as described later.

Second web 50 is joined to web 10 by aligning its edge 51 relative to first leads 41-46. The visual alignment lines 48 and 49 are employed to assist the person operating the laminating equipment in registering edge 51 of second web 50 in such fashion as to leave connection end portions B' of each first lead exposed. Thus, with reference to the middle first circuit 20 shown in FIG. 6, the edge 51 of the second web is illustrated as being aligned over outboard line 48. The space between lines 48 and 49 gives the operator a visual indication of the acceptable tolerance for the edge registration of second web 50. Also, the operator can check the accuracy of the placement of the second web as the laminating equipment is being run by reference to lines 48 and 49. The laminating equipment can maintain the edge registration, and various other systems can be employed for achieving the appropriate edge registration of web 50 relative to the first leads. Also, it is important that lamination of second web 50 in this step should leave the registrations means 11 exposed or readable by sensing equipment so as to be usable for subsequent steps of the method.

Step (7), FIGS. 7 and 7A

After second web 50 has been joined to the substrate web 10 as described in step (6), a plurality of conductive second circuits 60 are applied onto the exposed surface 50a of second web 50. The application of the first components of second circuits is illustrated in FIGS. 7 and 7A.

A conductive second circuit 60 is to be applied onto second web 50 over each first circuit 20 formed on the substrate web. In the first embodiment illustrated in the drawings, the first component of each second circuit 60 comprises a plurality of evenly spaced conductive second traces that are arranged orthogonal to the first traces of each first circuit 20. The second circuits may include a large number of second traces, but only five second traces 61-65 are illustrated in the drawings for clarity of description. Second circuits 60 can be applied to a second web by means of vacuum deposition techniques or by printing techniques such as screen printing; typically, the second circuits will be applied to the web 50 by the same technique employed for formation of first circuits 20 on the substrate web. As shown in FIG. 7, each second trace 61-65 has a portion D traversing the first traces 21-27 of circuits 20 and a portion E extending along web 50 beyond the boundary of each first circuit.

Accurate registration of the second circuits 60 relative to first circuits 20 is achieved by aligning with the registration means 11 by whatever system is appropriate for the equipment used to form the second circuits.

Step (8), FIGS. 8 and 8A

Upon completion of step (7), the next step in the process of the invention is illustrated in FIGS. 8 and 8A which comprises applying a second dielectric coating 70 onto surface 50a of second web 50 that extends over part of end portions E of each second trace 61-65. Second dielectric coating is applied in a pattern to include an aperture over each second trace. Thus, as shown in FIG. 8, second dielectric coating 70 includes aperture 71 over second trace 61, aperture 72 over trace 62, aperture 73 over trace 63, aperture 74 over trace 64 and aperture 75 over trace 65; the apertures can be arranged with two or more in a column such as illustrated with respect to apertures 72 and 75. The second dielectric coatings 70 can be of the same composition as first dielectric coatings 30 described above.

There is a second dielectric coating 70 for each second circuit formed on a second web 50. The registration means 11 are employed by the equipment used to apply the second dielectric coating to accurately position each second dielectric coating relative to its respective second circuit and the second traces thereof.

Step (9), FIGS. 9 and 9A.

Turning now to FIGS. 9 and 9A, the next step in the process of the invention comprises forming the second components of each second circuit comprising a plurality of conductive second leads on each second dielectric coating. As illustrated in FIG. 9, conductive second leads 81-84 are applied over each second dielectric coating 70 to provide a second lead for each transverse row of apertures in a coating 70. Each lead 81-84 makes electrical contact through an aperture 71-75 with a respective second trace 61-65 within an aperture. Thus, second lead 81 makes electrical contact with second trace 61 within aperture 71. Similarly, second lead 82 makes electrical contact with second trace 63 within aperture 73, second lead 83 makes electrical contact with second trace 64 within aperture 74, and second lead 84 makes electrical contact with second trace 62 and second trace 65 within apertures 72 and 75, respectively.

Further, and also as illustrated in FIGS. 9 and 9A, second leads 81-84 extend beyond the boundary of a second dielectric coating 70 onto surface 50a of second web 50 to the nearby longitudinal edge 51 of the second web. Thus, each second lead 81-84 has an end portion F on the exposed surface of the second web, as shown by portion F of second lead 81.

The second leads, such as leads 81-84, must be accurately registered with respect to the apertures, such as apertures 71-75, in each second dielectric coating 70 and the second traces of each second circuit. The registration means 11 defined in the substrate web are employed by the equipment utilized to apply the second traces to achieve accurate positioning thereof in a manner appropriate to the specific equipment used.

Step (10), FIGS. 10 and 10A

As the penultimate step of the method illustrated by the first embodiment, a covering layer 90 is applied over the second circuits 60 formed on second web 50. Covering layer 90 can comprise a web of flexible plastic film laminated over a second web in the manner described previously with respect to lamination of the second web to the substrate web and can be the same type of plastic film material employed for the substrate and second webs although it can be any thin plastic film such as on the order of ¼ mil to 5 mils thick. Also, however, covering layer 90 can be applied in the form of a coating, such as a thermoplastic, thermoset or UV curable coating. Layer 90 should be transparent or translucent when the panels formed by the process are to be transparent.

Covering layer 90 can be used when the membrane panels produced by the method need to be protected against physical damage such as abrasion or an operating environment in which liquids or other foreign matter may be spilled or dropped on the panels. If neither of these conditions is applicable, the covering layer 90 can be omitted.

Covering layer 90 is shown in the first embodiment as being narrower in width than second web 50, particularly along longitudinal edge 51 of the second web. This provides a short connection end portion of each second lead 81-84 on the second web that is exposed between longitudinal edge 91 of covering layer 90 and longitudinal edge 51 of second web 50; the exposed end portions of the second leads are indicated by portion F' of second lead 81. An end portion F' of each second lead will be used for connecting the second leads to external circuitry, as described later.

Upon completion of Step (10), the present method results in a composite web structure comprising second web 50 joined to substrate web 10, with each first circuit on web 10 aligned with a second circuit on web 50 to form a plurality of electronic membrane panels, each including a first circuit and a second circuit and which are arranged in columns and rows along the composite web structure.

Covering layer 90 should be accurately positioned with respect to web 50 and web 10. When covering layer 90 is applied as a film laminated to the second web, it can be registered relative to the second web by edge registration in the manner described previously in connection with lamination of second web 50 to substrate web 10. If the covering layer is applied as a coating, the coating is positioned by use of the registration means 11 during application of the covering layer, in whatever manner is appropriate to the specific equipment and type of material used to coat the layer.

Step (11), FIG. 11.

The final step in the method of the invention involves cutting individual touch panels from the composite web structure produced by Steps (1)–(10) of the method as previously described, bearing in mind that the structure obtained upon completion of Step (10) comprises a plurality of touch panels in web form. Referring to FIG. 11, which illustrates the last step of the method in perspective, an individual touch panel 100 is cut, such as by die cutting, from the composite web structure by cutting transversely across the web structure between each row of first and second circuits, cutting longitudinally through covering layer 90, second web 50 and substrate web 10 along the right edge of each set of first and second circuits, and cutting longitudinally through substrate web 10 along the left edge of each first and second circuit a short distance outboard from the nearby edge 51 of a second web 50. If desired, the transverse cuts can extend from edge to edge of substrate web 10 to form sheets, and then each sheet can be cut longitudinally to form individual panels. An individual panel 100 includes a narrow edge portion 101 of the substrate web that is not covered by either the second web or the covering layer and which includes exposed end portions B' of each first lead 42–46. Also, each panel 100 includes a narrow edge portion 102 of second web 50 that is not covered by covering layer 90, and end portions F' of each second lead 81–84 are exposed along edge portion 102 of the second web. External drive and sense circuitry to be connected with a touch panel 100 are connected to the first circuit 20 of a touch panel along the exposed end portions B' of the first traces thereof, and connected to the second circuit 60 of the panel by connection to the exposed end portions F' of the second traces thereof.

As was the case with the preceding steps, individual panels 100 are accurately cut from the composite web structure by aligning the substrate web with the cutting equipment using the registrations means 11 formed in substrate web 10.

(2) Second Embodiment, FIGS. 12–14

The method of the invention as described with respect to FIGS. 1–11 can be employed to manufacture electrical membrane panels of varying sizes. However, the method of the first embodiment is particularly adapted for the manufacture of large size panels that have a large number of first and second traces and more than one trace is connected to a first or second lead; for example, the method of the first embodiment of the invention was demonstrated during our development work to successfully produce panels approximately 10 inches by 12 inches in size that had 78 first traces, 60 second traces, and 16 each of the first and second leads.

The second embodiment illustrated in FIGS. 12–14 demonstrates the manner in which the present invention can be used for the manufacture of smaller touch panels, such as those which may have about 16 to 32 first traces and second traces.

Step (1) and Step (2)

The first step of the second embodiment of the invention is the same as Step (1) described above with reference to FIG. 1, and the second step of the second embodiment is the same as step (2) described above with respect to FIG. 2 of the first embodiment.

Step (3), FIGS. 12 and 12A

The third step of the second method is illustrated in FIG. 12 in plan view and in cross section in FIG. 12A. A plurality of first circuits 20 are applied onto surface 10a of substrate web 10, each first circuit including a plurality of first traces such as traces 21–26. Also, however, first leads 41–45 are formed integral with and at the same time as first traces 21–26, each first trace 41–46 including a longitudinal section A and a transverse section B as illustrated with reference to first lead 46.

Thus, the second embodiment of the inventive method does not employ step (4) of the first embodiment in which a dielectric coating was printed on the substrate web or step (5) of the first embodiment in which first leads were separately applied onto the dielectric coating.

Step (4), FIGS. 13 and 13A

The fourth step of the second embodiment is that of laminating second web 50 onto substrate web 10 in such fashion as to cover each first circuit 20 formed on the web, including the first leads 41–46 except for the short connection end portion B' of each first lead. This step of the second embodiment is carried out in the same manner described above with respect to step (6) of the first embodiment.

Step (5), FIGS. 14 and 14A

The next step in the method of the second embodiment, as illustrated in FIG. 14, is that of applying a plurality of conductive second circuits 60 on the exposed surface of second web 50. Each circuit 60 is of the same construction as described previously, and is illustrated as including second traces 61–65 arranged orthogonally to the first traces of the first circuits 20. Simultaneously with the application of the second traces of second circuit 60, conductive second leads 81–85 are formed as elements integral first traces 61–65 and extend transversely across second web 50 to edge 51 of the second web. Registration means 11 are employed to achieve accurate placement of each second circuit 60 relative to its underlying first circuit 20.

With respect to formation of the second circuits 60, the second traces and second leads are formed as integral conductive elements and this embodiment thus eliminates the need to apply a second dielectric coating over the leads and then separately printing second leads on the second dielectric coating as described in steps (8) and (9) of the first method.

Step (6), Second Embodiment

The sixth step of the second embodiment, in which a covering layer 90 is applied over the second circuits, will be the same as step (10) of the first embodiment. However, it should again be noted that some uses of the panels to be formed by the method may not require a covering layer.

Step (7), Second Embodiment

The final step in the method of the second embodiment is the same as step (11) of the first embodiment wherein individual touch panels are cut from the composite web structure resulting from steps (1)–(6). This step can be carried out in the same manner described previously with respect to the first embodiment.

The method as set forth in this second embodiment is particularly adapted to the manufacture of panels having a smaller number of first and second traces as compared to the first embodiment in which each trace can be connected to only one lead and the resulting panel will not have an unduly large connection tail or border portion. For example, 16 or 32 pin connectors can be used to connect external sense and drive circuitry to a panel formed by the method of the second embodiment

(3) Alternate Structures

In the preceding description, the second web 50 has been illustrated as being narrower in width than the substrate web 10. However, in the practice of the invention, it is only important that a longitudinal edge of the second web be properly aligned with the substrate web so as to leave connecting end portions B' of the first leads on the substrate web exposed for connection to external circuitry. This can also be accomplished by the composite web structure illustrated in FIG. 15 wherein second web 50 is offset relative to substrate web 10 with its edge 51 arranged relative to connecting end portions B' of the first traces in the manner previously described but with its opposite edge 52 extending beyond the nearby adjacent edge 17 of substrate web 10. This feature allows the second web 50 to be of the same width as substrate 10 which will oftentimes facilitate the manufacturing process; also, second web 50 can be wider than web 10. A single aperture is used in web 10 as the registration means 11 which is along its edge portion not covered by web 50.

Figure 16:
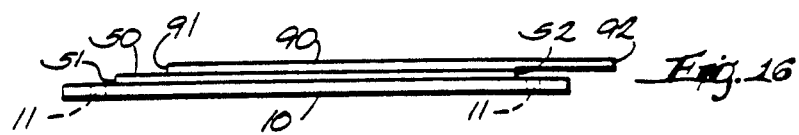
FIG. 16 is a sectional view illustrating an alternate arrangement of the covering layer relative to other webs in the composite structure suitable for the practice of the invention.

Covering layer 90 has been illustrated and described above as being narrower than second web 50 so as to leave connecting end portions F' of the second leads exposed for connection to external circuitry. This feature also, however, can be provided by employing a covering layer 90 that is wider than second web 50, and this construction is illustrated in FIG. 16. Edge 91 of covering layer 90 is offset from nearby edge 51 of second web 50 so as to expose connecting edge portions F' of the second leads. However, the opposite edge 92 of covering layer 90 can extend beyond the nearby edge 52 of the second web. This alternate version of the composite web structure can be employed when covering layer 90 is a plastic film laminated to the second web. This feature may also facilitate manufacture in that the second web and covering layer films can be of the same width.

The structures illustrated in FIGS. 1–14 and described above show a single column of electrical membrane panels formed along the substrate and second webs. However, the method of the invention can be employed to form two or more columns of panels along the web composite structure, wherein a row will include more than one panel.

Figure 17:
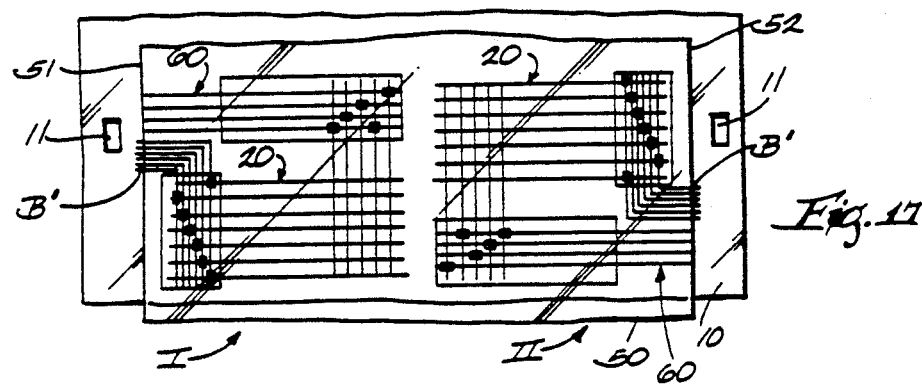
FIG. 17 is a plan view illustrating the method of the invention employed to form two columns of electrical membrane panels along a composite web structure.

FIG. 17 illustrates a composite web construction which may be employed to form two columns of panels along the web structure. FIG. 17 illustrates the product formed upon completion of steps (1) through (9) of the first embodiment of the invention previously described, but the structure also can be per steps (1)–(5) of the second embodiment. The panels of left column I in FIG. 17 will each include a first circuit 20 and second circuit 60 together with connecting leads and dielectric coatings as applicable. The panels in the right column II of FIG. 17 each include all of the same circuitry except that it will be noted the circuits in this column are oriented at 180° relative to the circuits in column I. This arrangement allows a single second web 50 to cover both columns of circuits and still expose the connecting end portions B' of each first lead of the first circuits 20 in column I which extend beyond edge 51 of the second web and also leave exposed the connecting end portions B' of the first leads of the panels of column II which extend beyond the opposite edge 52 of the second web. A single covering layer 90 (not shown) can be similarly applied so as to expose the connection end portions F' of the leads of the second circuits in columns I and II.

Individual panels can be cut from the composite web after completion of the steps subsequent to the product of FIG. 17 by first cutting the composite web into sheets having a row of panels and thereafter cutting individual panels from each sheet.

Figure 18:
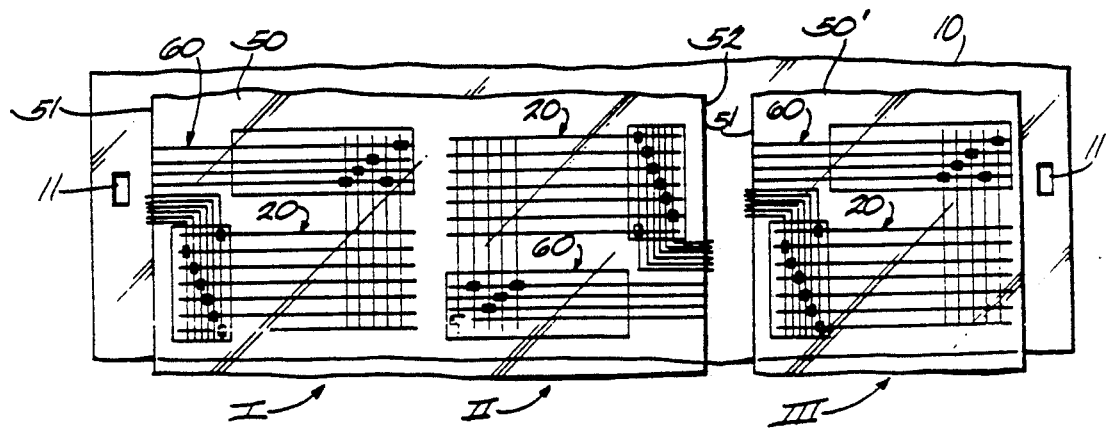
FIG. 18 is a plan view illustrating the method of the invention employed to form three columns of electrical membrane panels along a composite web structure.

FIG. 18 illustrates an application of the present method for producing a composite web structure including three columns of electrical membrane panels.

Columns I and II of the composite web structure shown in FIG. 18 are formed in the same manner as described above in connection with the formation of columns I and II of FIG. 17. A third column III can include circuits oriented in the same manner as those of column I as illustrated, or oriented the same as the circuits of column III. The circuits of column III are spaced from those of columns I and II, and a second web 50' is laminated over the circuits of column III either concurrently with or subsequent to lamination of second web 50 over the circuits of columns I and II.

After completing the subsequent processing steps, the composite web structure of FIG. 18 can be cut into sheets in which each sheet includes one row of three panels, and then individual panels are cut from each sheet.

There has thus been described a new process for the manufacture of a electrical or electronic membrane panels in which each panel includes spaced conductive circuits formed on the surfaces of two separate layers of flexible plastic film wherein the two films remain in elongated web form during the manufacture of the entire membrane panel, following which individual panels are cut from the composite web structure. Practice of the new process results in a web structure that includes a plurality of membrane panels arranged in rows and columns along the composite web structure. For example, during development of the present invention, we have produced panels with the first embodiment of the new process using elongated substrate and second webs that were 440 feet long on which we applied 350 panels in one column. The process provides an efficient method for manufacturing membrane panels and is especially useful for the production of panels that incorporate at least one very thin film layer, such as a layer as thin as one-quarter mil for the second web, inasmuch as it enables handling very thin plastic films in a manner which will reduce physical damage to the films. Examples of uses of electronic membrane panels made by the inventive method include transparent touch panels adhered over a display such as a CRT screen, LCD display or plasma display, and digitizer panels which can be opaque or transparent.

In the practice of our new method as described above, bearing in mind that the substrate web and second web are maintained in elongated web form until after individual electronic membrane panels are cut from the composite web structure, we have found it convenient to roll the web in between the individual steps. Thus, for example, we have found it convenient and practical to carry out the first embodiment of the process by rolling the substrate web 10 after the completion of each of steps (3)–(5), rolling the composite of the substrate web 10 and second web 50 upon the completion of each of the steps (6)–(9), and rolling the composite of the substrate web 10, second web 50 and covering layer 90 after the completion of step (10). It is also possible to practice the process without rolling up the web or composite web structures after each step, depending upon the size of the panels to be made by the process and the equipment to be used for forming the various components of each panel. We have also found it desirable to arrange the first and second circuits and their associated components at a slight angle in the range of about 5° to 10° to the longitudinal axis of the substrate web when screen printing is employed so as to eliminate squeegee bounce during the printing process due to having a plurality of traces and/or leads oriented perpendicular to the axis of the substrate or second webs.. When screen printing is used to apply any of the circuit components, such as the first or second traces or first or second leads, any suitable conductive ink typically employed in membrane switch manufacture can be used, such as conductive ink including silver particles, carbon particles, a blend of silver and carbon particles, etc., of which many suitable types are available commercially. When a vacuum deposition technique is used to apply any of the components of the first or second circuits, indium tin oxide can be applied by vacuum deposition, particularly if a transparent panel is the desired end product, but metals and metal alloys can be applied such as silver, copper, etc. The process for producing patterned vacuum deposition coatings as described in commonly-assigned U.S. Pat. Nos. 4,714,631 and 4,895,630 is particularly useful when vacuum deposition is used.

Although the invention has been described above by reference to a complete and enabling description of specific embodiments for its practice, it is anticipated those of ordinary skill in the art can devise changes to the exemplary methods described that will remain within the scope of the invention as set forth in the appended claims.

We claim:

1. A method for manufacturing electrical membrane panels including conductive first and second circuits on spaced surfaces of two plastic films including, in sequence, the steps of:
   (1) providing a substrate web of flexible plastic film;
   (2) defining a plurality of registration means longitudinally along the substrate web, there being a registration means for each row of circuits to be applied onto the web in subsequent steps;
   (3) applying a plurality of spaced apart conductive first circuits along a first surface of the substrate web by aligning with the registration means during application thereof,
      (a) the first circuits being arranged in rows and columns along the first surface of the substrate web, with at least one column thereof and at least one first circuit in each row,
      (b) each first circuit comprising a plurality of conductive first traces and first leads, and each first lead including a connection end portion;
   (4) laminating a second web of flexible plastic film to the substrate web by aligning a longitudinal edge of the second web relative to the first circuits to cover the first circuits except for the connection end portions of each first lead;
   (5) applying a plurality of spaced apart conductive second circuits along the first surface of the second web by aligning with the registration means during application thereof,
      (a) there being a second circuit registered with each first circuit;
      (b) each second circuit comprising a plurality of conductive second traces arranged in selected registration with the first traces of a first circuit, and a plurality of second leads each including a connection end portion;

thereby forming a plurality of membrane panels each including a first circuit and a second circuit with the connection end portions of the first leads exposed along the substrate web and the connection end portions of the second leads exposed along the second web.

2. A method for manufacturing electrical membrane panels including conductive first and second circuits on spaced surfaces of two plastic films including, in sequence, the steps of:

(1) providing a substrate web of flexible plastic film;

(2) defining a plurality of registration means longitudinally along the substrate web, there being a registration means for each row of circuits to be applied onto the web in subsequent steps;

(3) forming first components of a plurality of spaced apart conductive first circuits by applying conductive first traces along a first surface of the substrate web by aligning with the registration means during application of the first traces, there being a group of first traces for each first circuit arranged in rows and columns along the first surface of the substrate web, with at least one column thereof and at least one in each row;

(4) applying a first dielectric coating onto the first surface of the substrate web over portions of the first traces of each first circuit by aligning with the registration means during application thereof, there being a first dielectric coating for each first circuit including an aperture over each first trace thereof;

(5) forming second components of the first circuits by applying a plurality of conductive first leads onto each first dielectric coating by aligning with the registration means during application thereof, whereby each first trace of each first circuit is in electrical contact with at least one first lead within an aperture of the first dielectric coating for said circuit, each first lead including a connection end portion exposed on the first surface of the substrate web adjacent its respective first dielectric coating;

(6) laminating a second web of flexible plastic film to the substrate web by aligning the second web relative to the first circuits and laminating it to the substrate web to cover the first circuits thereon except for the connection end portions of each first lead;

(7) forming first components of a plurality of spaced apart conductive second circuits by applying conductive second traces along a first surface of the second web by aligning with the registration means during application of the second traces, (a) the second circuits each including a plurality of conductive second traces arranged in selected registration with the first traces of the first circuits, and (b) there being a second circuit registered with each first circuit;

(8) applying a second dielectric coating onto the first surface of the second web over portions of the second traces of each second circuit by aligning with the registration means during application thereof, each second dielectric coating including an aperture over each second trace;

(9) forming second components of the second circuits by applying a plurality of conductive second leads onto each second dielectric coating by aligning with the registration means during application thereof, whereby each second trace of each second circuit is in electrical contact with at least one second lead within an aperture in the second dielectric coating, each second lead including a connection end portion exposed on the first surface of the second web adjacent its respective second dielectric coating;

thereby forming a plurality of membrane panels, each including a first circuit and a second circuit with the connection end portions of the first leads exposed along the substrate web and the connection end portions of the second leads exposed along the second web.

3. A method according to claim 1 or 2 further including:

a penultimate step of applying a covering layer over the second web arranged to cover the second circuits except for the connection end portions of the second leads thereof; and severing individual membrane panels from the composite product resulting upon completion of the penultimate step.

4. A method according to claim 1 or 2 wherein:

step (1) comprises providing a substrate web including a layer of adhesive along a second surface opposite from its first surface and a release liner over the adhesive.

5. A method according to claim 1 or 2 wherein:

step (1) comprises providing a substrate web and a carrier web joined to a second surface of the substrate web opposite from its first surface.

6. A method according to claim 1 or 2 wherein:

two columns of first circuits and second circuits are formed along the substrate and second web to provide rows of membrane panels with two panels in each row.

7. A method according to claim 1 or 2 wherein:

three columns of first circuits are formed along the substrate, a second web is laminated to the substrate web to cover two columns of first circuits, another second web is laminated to the substrate web to cover one column of first circuits, and three columns of second circuits are applied onto the second webs to provide rows of membrane panels with three panels in each row.

8. A method according to claim 1 or 2 wherein:

the first traces of each first circuit and the second traces of each second circuit of a membrane panel are arranged orthogonally to each other.

* * * * *